United States Patent
Hegde et al.

(10) Patent No.: US 9,613,907 B2
(45) Date of Patent: Apr. 4, 2017

(54) LOW RESISTIVITY DAMASCENE INTERCONNECT

(71) Applicant: Samsung Electronics Co., Ltd., Suwon-si, Gyeonggi-do (KR)

(72) Inventors: Ganesh Hegde, Austin, TX (US); Mark S. Rodder, Dallas, TX (US); Jorge A. Kittl, Round Rock, TX (US); Robert C. Bowen, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/809,266

(22) Filed: Jul. 26, 2015

(65) Prior Publication Data

US 2016/0035675 A1 Feb. 4, 2016

Related U.S. Application Data

(60) Provisional application No. 62/030,523, filed on Jul. 29, 2014.

(51) Int. Cl.
*H01L 23/532* (2006.01)
*H01L 21/768* (2006.01)

(52) U.S. Cl.
CPC .. *H01L 23/53238* (2013.01); *H01L 21/76844* (2013.01); *H01L 21/76846* (2013.01); *H01L 21/76877* (2013.01); *H01L 2924/0002* (2013.01)

(58) Field of Classification Search
CPC ......... H01L 23/53242; H01L 23/53228; H01L 23/53219; H01L 23/53252; H01L 23/528; H01L 23/53223; H01L 23/53238; H01L 21/76802; H01L 21/76846; H01L 21/76871
See application file for complete search history.

(56) References Cited

U.S. PATENT DOCUMENTS

| | | | |
|---|---|---|---|
| 6,281,121 B1 | 8/2001 | Brown et al. | |
| 6,288,449 B1 * | 9/2001 | Bhowmik | H01L 21/76843 257/762 |
| 6,355,558 B1 * | 3/2002 | Dixit | H01L 21/32135 257/E21.31 |
| 6,387,800 B1 * | 5/2002 | Liu | H01L 21/2855 257/751 |
| 7,875,977 B2 | 1/2011 | Barth et al. | |
| 7,956,463 B2 | 6/2011 | Yang et al. | |

(Continued)

*Primary Examiner* — Christine Enad
(74) *Attorney, Agent, or Firm* — Renaissance IP Law Group LLP

(57) ABSTRACT

A damascene interconnect structure may be formed by forming a trench in an ILD. A diffusion barrier may be deposited on trench surfaces, followed by a first liner material. The first liner material may be removed from a bottom surface of the trench. A second liner material may be directionally deposited on the bottom. A conductive seed layer may be deposited on the first and second liner materials, and a conductive material may fill in the trench. A CMP process can remove excess material from the top of the structure. A damascene interconnect may include a dielectric having a trench, a first liner layer arranged on trench sidewalls, and a second liner layer arranged on a trench bottom. A conductive material may fill the trench. The first liner material may have low wettability and the second liner material may have high wettability with respect to the conductive material.

20 Claims, 9 Drawing Sheets

(56) References Cited

U.S. PATENT DOCUMENTS

| | | |
|---|---|---|
| 8,198,730 B2 | 6/2012 | Tagami et al. |
| 2008/0079165 A1* | 4/2008 | Fischer ............. H01L 21/76843 257/762 |
| 2010/0200991 A1* | 8/2010 | Akolkar ................ C23C 16/045 257/751 |
| 2013/0093089 A1* | 4/2013 | Yang ................. H01L 21/76846 257/751 |
| 2013/0270703 A1* | 10/2013 | Zierath ............. H01L 21/76877 257/751 |
| 2014/0097538 A1* | 4/2014 | Zhao ................ H01L 23/53238 257/751 |
| 2015/0137373 A1* | 5/2015 | Zhang .............. H01L 21/76846 257/751 |

* cited by examiner

LOW RESISTIVITY DAMASCENE INTERCONNECT

CROSS-REFERENCE TO RELATED APPLICATIONS

This U.S. non-provisional patent application is a non-provisional of, and claims priority under 35 U.S.C. §119(e) to, U.S. Provisional Patent Application Ser. No. 62/030,523, filed Jul. 29, 2014, and entitled "Low Resistivity Damascene Interconnect," the contents of which are incorporated herein by reference in their entirety.

TECHNICAL FIELD

The principles of the present inventive concepts relate generally to the construction of semiconductor devices, and more specifically, to a method of forming a damascene interconnect or via structure having low resistivity, as well as to a low resistivity damascene interconnect.

BACKGROUND

Semiconductor devices may be used in a variety of electronic devices, including, for example, personal computers, cell phones, digital cameras, tablets, and numerous other electronic devices. Semiconductor devices are typically fabricated by sequentially depositing insulating or dielectric layers, conductive layers, and semiconductive layers of material over a semiconductor substrate, and then patterning the various layers to form circuit components and elements thereon.

As technology progresses, the demand for smaller and smaller semiconductor devices with improved performance is increasing. Unfortunately, however, the scaling down of semiconductor devices has resulted in other problems. For example, as feature size decreases, resistance increases, and an RC time delay (defined as the product of the chip equivalent resistance (R') and the equivalent capacitance (C')) limits the propagation delay. With scaling, an increasing portion of the chip equivalent resistance and capacitance is composed of metal resistance (R) and interlayer dielectric (ILD) contributed capacitance (C). To reduce the overall time delay, low dielectric constant materials may be used as insulating materials, and copper (Cu) may be used as an interconnect material.

Various methods have been proposed for growing larger Cu grains or controlling grain growth in damascene interconnect structures.

SUMMARY

The present inventive concepts provide a method of forming a low resistivity damascene interconnect structure, and further provide a low resistivity damascene interconnect structure having a morphology with a dominant grain orientation suitable for electron transport and with low grain boundary scattering.

Copper interconnects are typically formed through a damascene process. Because of the lower bulk resistivity of copper, using copper as an interconnect material for semiconductor devices provides increased speed by decreasing the RC time delay experienced by previous technology generations. Copper also has increased electromigration resistance. Reduced resistivity allows thinner conductive lines and/or lower aspect ratio conductive lines, reducing the sidewall capacitance of the conductive lines. Also, with improved electromigration resistance, higher current densities may be used. Combining copper interconnects with low-k dielectric materials increases interconnect speed.

It is difficult, however, to directly etch copper (such as through a subtractive etch process) and copper interconnects are therefore often formed using a damascene process. In a damascene process, a dielectric material is deposited on a wafer, and the dielectric material is then patterned with a conductive line pattern. Trenches are formed in the dielectric material and filled in with conductive material, and a chemical-mechanical polish or planarization (CMP) process is then used to remove the excess conductive material from the top surface of the dielectric material. The conductive material remaining within the dielectric material provides the conductive line.

Due to its low reactivity with atoms forming the ILD, copper diffuses easily into some dielectric materials, especially some types of low-k dielectric materials, a barrier or liner layer is usually deposited over the insulating material before the copper is formed. Unfortunately, however, barrier and liner layers may increase the resistance of the copper conductive lines, especially in features with a narrow pitch width (i.e., less than 30 nm).

Conventional methods for forming damascene interconnect structures do not pay sufficient attention to the various interfaces that have begun to play a larger and larger role in grain formation as a result of higher product integration. In particular, conventional methods do not address the problems resulting from scaling of interconnect dimensions without a commensurate linear scaling of liner and barrier materials.

Unfortunately, liner and barrier dimensions do not scale linearly with pitch dimensions. In particular, since it is desirable to prevent interconnect metal diffusion into the dielectric material while promoting adhesion to the dielectric, this requires that a certain minimum amount of liner and barrier material be used regardless of pitch dimension. The unintended consequence of this is that the dominant grain orientation at smaller pitch dimensions (e.g., 15 nm and below) is not governed solely by the free surface energy of Cu and the interface energy of its nanocrystalline components. Instead, competition to minimize the formation energy results between the sidewall/Cu interface, the trench bottom/Cu interface, the free surface energy of Cu and the relative interface energies of nanocrystalline grains. This competition may result in a grain orientation distribution that lacks a single dominant orientation. A disparate orientation of grain structures adds to scattering and impedes the flow of electrons through the interconnect structure.

What is needed, therefore, is a method of forming a damascene interconnect structure that results in a dominant [111] crystalline structure transverse to the direction of propagation in damascene structures having a pitch dimension of approximately 30 nm or less, and most preferably, 15 nm or less. It would similarly be desirable to have a damascene interconnect structure with a pitch dimension of 30nm or less (and most preferably 15 nm or less) that has a dominant [111] crystalline orientation transverse to the transport direction. The present inventive concepts may also improve damascene interconnect structures having pitch dimensions greater than 30 nm.

The present inventive concepts provide a solution to the problems of the prior art by addressing the competing energy minimization mechanisms in more integrated damascene structures. In particular, according to the present inventive concepts, a liner layer material may be selected such that the Cu grain orientation is controlled primarily by energy minimization of the free Cu surface and trench bottom/Cu layer.

The principles of the present inventive concepts therefore contemplate the provision of a liner material having a first surface energy along sidewalls of the trench, and a liner material having a second surface energy along the bottom of the trench. The set of liner materials for the trench sidewall and bottom have different interface energy relative to the interconnect material (i.e., Cu Al, Ag, and/or Au). For instance, the relative wettability of the sidewall liner material with the conductive metal should be lower than the wettability of the trench bottom liner material with the conductive metal.

A method of forming a low resistivity damascene interconnect comprises forming a trench in an interlayer dielectric, conformally depositing (i.e., via CVD or ALD process) a barrier layer to prevent diffusion, and conformally depositing a first liner material having very low wettability to Cu (for instance, tantalum (Ta)). A directional etching process may then be performed to remove the first liner material from trench bottom (for instance using a barrier sputter reactor). A second liner material (for instance, ruthenium (Ru)) having a very high wettability to Cu can then be directionally deposited on the trench bottom and a cleaning process can be performed to remove any second liner material from the trench sidewalls. PVD or conformal CVD deposition can be used to deposit a Cu seed layer coating the trench bottom and sidewalls. And electrodeposition of Cu can then be performed to fill in the resultant trench. A Chemical Mechanical Planarization (CMP) process can be performed to remove excess Cu. And annealing of the BEOL assembly can be performed to promote bonding between an adhesion layer and Cu. One or more of the process steps described above may be performed as many times as is required at desired locations on a chip to form any desired number of interconnects.

In an alternative embodiment, the first and second liner materials may comprise the same (or different) materials, but have different thicknesses from each other. By adjusting the relative thicknesses of the liner layers of the same (or different) materials, their effect on the subsequent grain formation of the conductive material may be controlled.

In an alternative embodiment, the deposition of high-wettability liner over the trench and sidewalls may be followed by a removal of the sidewalls and formation of the low wettability liner on the sidewalls.

According to principles of the present inventive concepts, therefore, by using a suitable combination of barrier or liner materials (Materials 1 and 2) and dimensions along the trench sidewalls and bottom, respectively, a Cu (or other suitable material) interconnect with a dominant [111] orientation transverse to direction of transport can be achieved even in interconnect structures having relatively small pitch dimensions.

BRIEF DESCRIPTION OF THE DRAWINGS

Exemplary embodiments of the inventive concepts will be more clearly understood from the following detailed description taken in conjunction with the accompanying drawings in which.

2H, further illustrating the results of a process of electrodepositing Cu on the seed layer to fill in the trench, according to principles of the present inventive concepts.

DETAILED DESCRIPTION

Figure 1A:
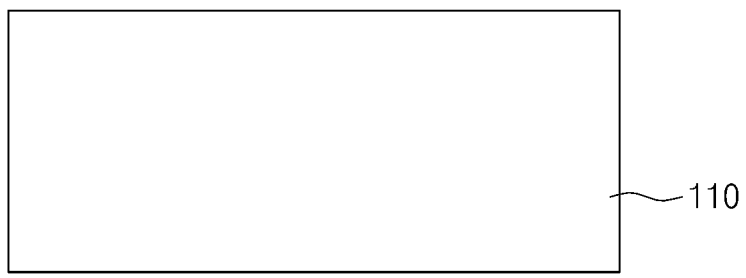
FIG. 1A is a schematic cross-sectional illustration of an inter-layer dielectric (ILD) being used in the formation of a damascene interconnect structure according to the conventional art.

Reference will now be made in detail to exemplary embodiments of the present inventive concepts, examples of which are illustrated in the accompanying drawings. It should be noted, however, that the inventive concepts are not limited to the exemplary embodiments illustrated hereinafter, and that the embodiments shown and described herein are intended only to provide an easy and more complete understanding of the scope and spirit of the inventive concepts and not to be limiting thereof. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms "first," "second," "third," etc., may be used herein to describe various elements, components, regions, layers and/or sections, these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (i.e., rotated 90 degrees, or at other orientations) and the spatially relative descriptors should be interpreted accordingly.

The terminology used herein is for describing particular embodiments only and is not intended to be limiting of the inventive concepts. As used herein, the singular forms "a," "an" and "the" are intended to include the plural forms as well, unless the context clearly indicates otherwise. It should also be understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations that result, for example, from manufacturing techniques and/or tolerances, are to be expected. Thus, the inventive concepts should not be construed as being limited to the particular shapes of regions illustrated herein but should be interpreted to include such deviations in shapes that may result, for example, from manufacturing inconsistencies. Thus, the regions, features, and layers illustrated in the figures are schematic in nature only and their shapes may not illustrate the actual shape of a region of a device. They are therefore not intended to limit the scope of the inventive concepts, unless explicitly stated otherwise.

Unless otherwise defined, all terms (including technical and scientific terms) used herein have the same meaning as commonly understood by one of ordinary skill in the art to which these exemplary embodiments belong. It should be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference throughout this specification to "one embodiment" or "an embodiment" means that a particular feature, structure, or characteristic described in connection with that embodiment is included in at least one embodiment of the present invention. Thus, the phrases "in one embodiment" or "in an embodiment" do not necessarily all refer to the same embodiment. Furthermore, the particular features, structures, or characteristics of each of the various embodiments may be combined in any suitable manner without departing from the principles of the present inventive concepts.

Figure 1B:
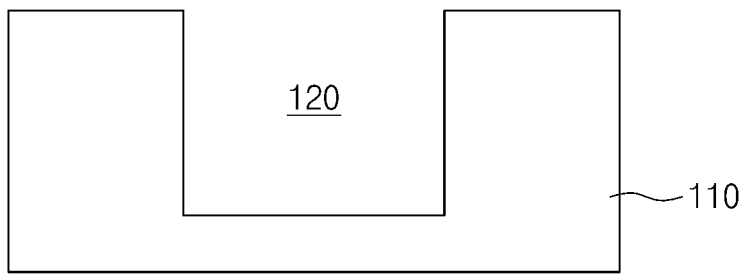
FIG. 1B is a schematic cross-sectional illustration of the ILD of FIG. 1A having a trench formed therein according to the conventional damascene process.

FIGS. 1A-1G are schematic cross-sectional views illustrating a conventional method of forming a damascene interconnect structure 100. FIG. 1A is a schematic cross-sectional illustration of a dielectric material being used as an inter-layer dielectric (ILD) 110 in the formation of a damascene interconnect structure 100 according to the conventional art, and FIG. 1B is a schematic cross-sectional illustration of the ILD 110 of FIG. 1A having a trench 120 formed therein according to the conventional damascene process. Referring first to FIGS. 1A and 1B, a damascene interconnect formation process typically begins by etching a trench 120 in the ILD 110 comprising a low k-dielectric material.

Figure 1C:
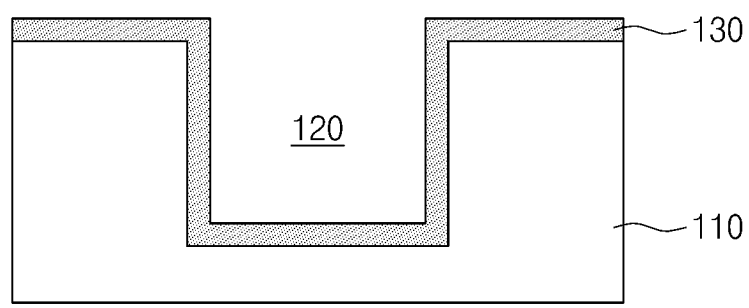
FIG. 1C is a schematic cross-sectional illustration of the ILD and trench of FIG. 1B having a diffusion barrier deposited thereon according to the conventional damascene process.
Figure 1D:
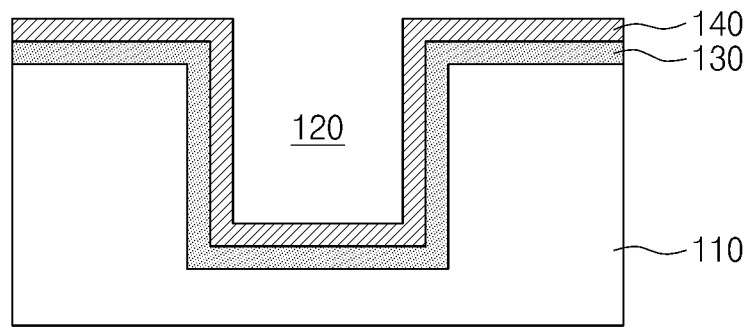
FIG. 1D is a schematic cross-sectional illustration of the ILD, trench, and barrier material of FIG. 1C, further showing a liner layer arranged over the barrier layer according to the conventional damascene process.

FIG. 1C is a schematic cross-sectional illustration of the ILD 110 and trench 120 of FIG. 1B having a diffusion barrier 130 deposited thereon according to the conventional damascene process. FIG. 1D is a schematic cross-sectional illustration of the ILD 110, trench 120, and barrier material 130 of FIG. 1C, further showing a liner layer 140 arranged over the barrier layer 130 according to the conventional damascene process. Referring now to FIGS. 1C and 1D, a thin metallic diffusion barrier 130 and an adhesion/liner layer 140 may be conformally deposited into the trench 120. The barrier layer 130 typically adheres well to the dielectric material 110 and serves to block metal diffusion into the dielectric material 110 and semiconductor substrate (not shown).

Figure 1E:
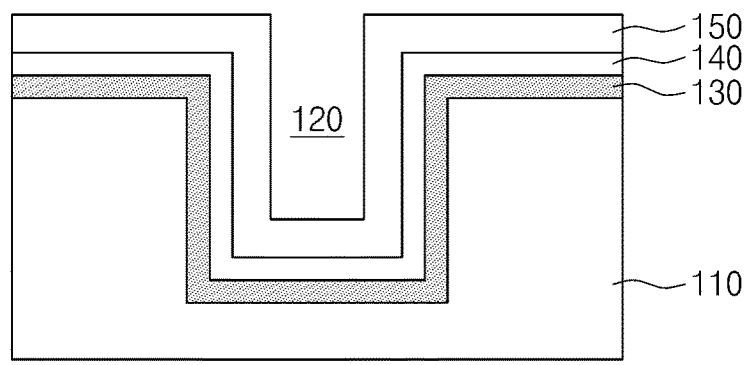
FIG. 1E is a schematic cross-sectional illustration of the ILD, trench, barrier layer, and liner layer of FIG. 1D, further illustrating a Cu seed layer deposited onto the liner layer, according to the conventional damascene process.
Figure 1F:
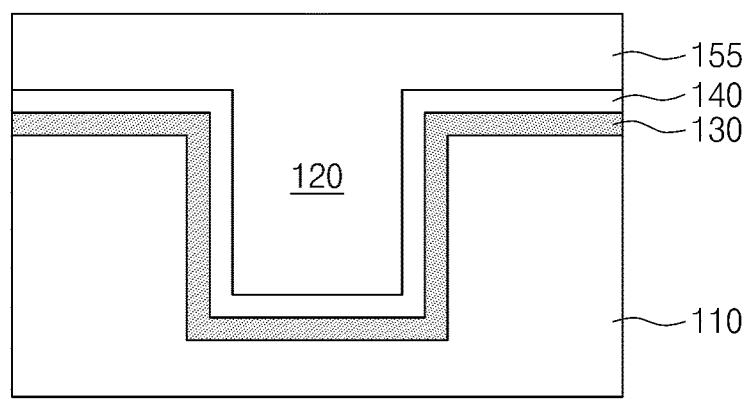
FIG. 1F is a schematic cross-sectional illustration of the ILD, trench, barrier layer, liner layer, and seed layer of FIG. 1E, further illustrating the results of an Cu electrodeposition process on the seed layer to fill in the trench, according to the conventional damascene process.

FIG. 1E is a schematic cross-sectional illustration of the ILD 110, trench 120, barrier layer 130, and liner layer 140 of FIG. 1D, further illustrating a Cu seed layer 150 deposited onto the liner layer 140, according to the conventional damascene process. FIG. 1F is a schematic cross-sectional illustration of the ILD 110, trench 120, barrier layer 130, liner layer 140, and seed layer 150 of FIG. 1E, further illustrating the results of electrodeposition of a conductive fill material (e.g., Cu) on the seed layer 150 to fill in the trench 120, according to the conventional damascene process. As illustrated in FIG. 1F, the seed layer 150 (see FIG. 1E) and conductive fill material may combine to form a conductive material layer 155. And FIG. 1G is a schematic cross-sectional illustration of the ILD 110, trench 120, barrier layer 130, liner layer 140, and conductive material layer 155 of FIG. 1F, further illustrating the results of a Chemical Mechanical Planarization (CMP) process performed to complete the conventional damascene interconnect structure 100.

Figure 1G:
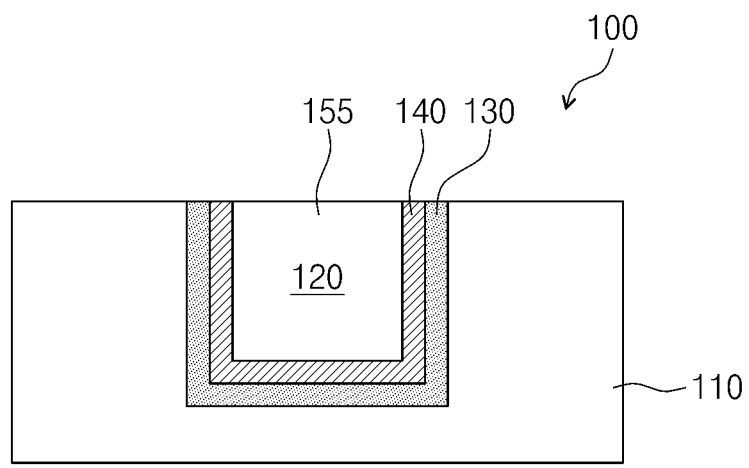
FIG. 1G is a schematic cross-sectional illustration of the ILD, trench, barrier layer, liner layer, seed layer, and electrodeposited Cu fill of FIG. 1F, further illustrating the results of a Chemical Mechanical Planarization (CMP) process performed to complete the conventional damascene interconnect structure.

Referring to FIGS. 1E through 1G, depositing the barrier 130 and liner 140 layers is generally followed by a seed-layer deposition of copper (Cu) 150 for adhesion to the liner 140, and then electrodeposition of a conductive material (e.g., Cu) to form a conductive material layer 155, followed by a Chemical Mechanical Polishing (CMP) process to finalize the damascene interconnect structure 100.

At large (i.e., >20-30 nm) interconnect pitch dimensions, the polycrystalline Cu line formed in the conventional damascene process typically retains a dominant [111] orientation transverse to the direction of electron transport. There are two primary advantages of having a Cu structure with a dominant [111] orientation transverse to a direction of propagation. First, Cu interconnect structures with a dominant [111] orientation in a Normal Direction (ND) have low inter-grain boundary scattering (as compared to situations where grain orientation is diverse). Second, Cu [111] structures arranged having an orientation that is the same as the transport direction perform poorly compared to [−211], [110], [100] or other directions transverse to the [111] grain structure. Therefore, providing a [111] grain characteristic that is transverse to the transport direction prevents a [111] grain formation in the transport direction.

It has been shown in previous studies of copper conductance at nanoscale dimensions (see, for instance, Hegde et al. J. Appl. Phys. 115, 123704 (2014)) that [111] as the transport orientation results in a large reduction in conductance compared to the case when [110] or [100] are dominant transport orientations. Ensuring that the crystalline structure has a dominant [111] character in the ND therefore prevents [111] from being dominant in the transport direction (RD), and thereby improves interconnect conductivity.

The ability to maintain an appropriate [111] orientation in larger pitch dimensions is primarily due to the fact that a Cu [111] free surface has minimum energy compared to other Cu crystallographic orientations, and that the amount of Cu atoms involved significantly exceeds the amount of liner or barrier material atoms involved. While at larger pitch dimensions, the conventional damascene process results in a suitable [111] orientation, the conventional method unfortunately does not pay sufficient attention to the various interfaces that play a larger and larger role in grain formation in more highly integrated products. In particular, conventional methods do not address the problems resulting from scaling of interconnect dimensions without a commensurate linear scaling of liner and barrier materials.

Unfortunately, liner and barrier dimensions do not scale linearly with pitch dimensions. In particular, since it is desirable to prevent interconnect metal diffusion into the dielectric material while promoting adhesion to the dielectric, this requires that a certain minimum amount of liner and barrier material be used regardless of pitch dimension. The unintended consequence of this is that the dominant grain orientation at smaller pitch dimensions (i.e., <about 20-30 nm and more particularly, <about 15 nm) is not governed solely by the free surface energy of Cu. Instead, competition to minimize the formation energy results between the sidewall/Cu interface, the trench bottom/Cu interface, the relative interface energy of Cu grains, and the free surface energy of Cu. This competition results in a grain orientation distribution that lacks a single dominant orientation. This disparate orientation of grain structures adds resistivity and impedes the flow of electrons through the interconnect structure.

The present inventive concepts provide a solution to the problems of the prior art by addressing the competing energy minimization mechanisms in more integrated damascene structures. In particular, the present inventive concepts provide a method of forming a low resistivity damascene interconnect structure that results in a dominant [111] crystalline structure transverse to the direction of propagation in more integrated damascene structures (i.e., having a pitch dimension of approximately 30 nm or less, and most preferably 15 nm or less). The present inventive concepts further provide a smaller damascene interconnect structure (i.e., with a pitch dimension of 30 nm or less, and most preferably 15 nm or less) that has a dominant [111] crystalline orientation transverse to the transport direction. The present inventive concepts can also improve damascene interconnect structures having pitch dimensions greater than 30 nm. In particular, according to the present inventive concepts, one or more liner layer materials and/or liner material dimensions may be selected such that the Cu grain orientation is controlled primarily by energy minimization of the free Cu surface and trench bottom/Cu layer.

FIGS. 2A-2J are schematic cross-sectional views illustrating a method of forming a damascene interconnect structure 200 according to principles of the present inventive concepts. A method of forming a low-resistivity damascene interconnect structure 200 will now be described in further detail with reference to FIGS. 2A through 2J.

Figure 2A:
FIG. 2A is a schematic cross-sectional illustration of an ILD being used in the formation of a damascene interconnect structure according to principles of the present inventive concepts.
Figure 2B:
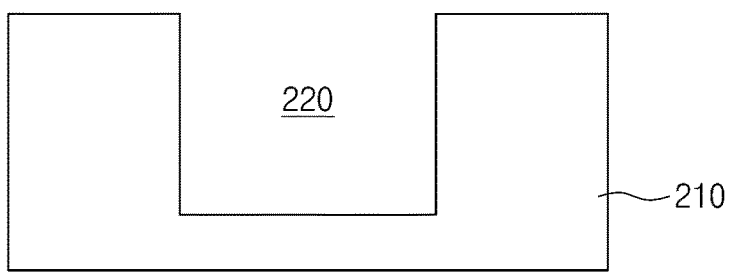
FIG. 2B is a schematic cross-sectional illustration of the ILD of FIG. 2A having a trench formed therein according to principles of the present inventive concepts.

FIG. 2A is a schematic cross-sectional illustration of a dielectric material being used to provide an inter-layer dielectric (ILD) 210 in the formation of a damascene interconnect structure 200 according to principles of the present inventive concepts. FIG. 2B is a schematic cross-sectional illustration of the ILD 210 of FIG. 2A having a trench 220 formed therein, and FIG. 2C is a schematic cross-sectional illustration of the ILD 210 and trench 220 of FIG. 2B having a diffusion barrier material 230 deposited thereon also according to principles of the present inventive concepts.

Figure 2C:
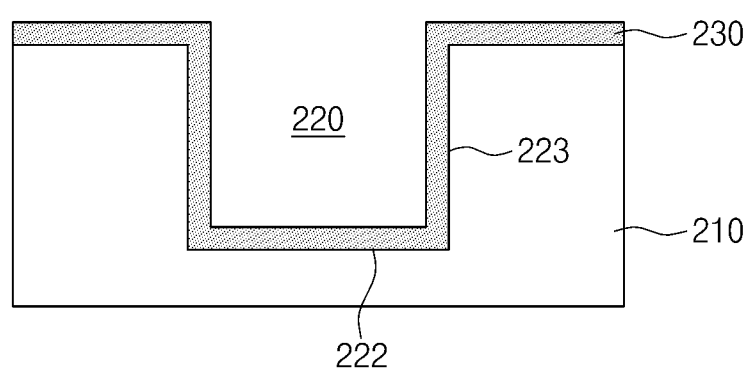
FIG. 2C is a schematic cross-sectional illustration of the ILD and trench of FIG. 2B having a diffusion barrier deposited thereon according to principles of the present inventive concepts.

Referring first to FIGS. 2A through 2C, an ILD 210 similar to that of the conventional damascene process may be used. Suitable ILD materials may include, for instance, $SiO_2$ or other suitable low-k dielectric materials such as organosilicon glass (OSG) or a SiCOH material. Suitable barrier materials may include, for instance, TiN, TiSiN, TiZr, TiZrN, Ru, WN, W, CoWP, CoWB, NiMoP, or TaN. The process of etching the ILD 210 to form a trench 220, and the process of conformally depositing a first barrier layer 230, may also be similar to the conventional processes described previously with reference to FIGS. 1A through 1C. A more detailed description thereof is therefore omitted.

Figure 2D:
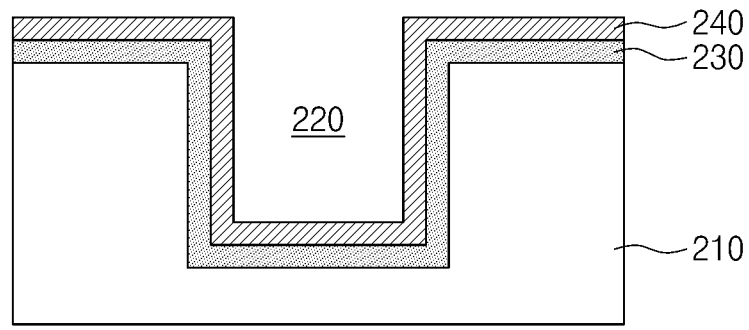
FIG. 2D is a schematic cross-sectional illustration of the ILD, trench, and barrier material of FIG. 2C, further showing a liner layer comprising a first liner material arranged over the barrier layer according to principles of the present inventive concepts.

FIG. 2D is a schematic cross-sectional illustration of the ILD 210, trench 220, and barrier layer 230 of FIG. 2C, further showing a liner layer 240 comprising a first liner material (Material 1) arranged over the barrier layer 230 according to principles of the present inventive concepts. Referring now to FIG. 2D, once the barrier 230 is formed along the trench bottom 222 and sides 223, a first liner material 240 may be conformally deposited on top of the diffusion barrier material 230, along both the bottom 222 and sidewalls 223 of the trench 220. The first liner material 240 is preferably selected to have low or poor wettability with respect to the conductive fill material (i.e., Cu) used to produce the conductive material layer 255 (see FIG. 2I) during deposition and initial grain growth. Suitable first liner materials 240 may, for instance, include tantalum (Ta), beta phase Ta, alpha phase Ta, or a high Ta content RuTa alloy. In addition, amorphous oxides such as Ta2O5, etc., may be used.

With respect to the interaction between the liner material and conductive fill material, "wettability" refers to the degree or strength of relative adhesive and cohesive forces that affect the strength of a bond between the two materials. More particularly, the degree of wetting (or "wettability") is determined by a force balance between adhesive and cohesive forces of the materials. Adhesive forces cause a stronger bond between contacting surfaces of the two materials, while cohesive forces within each material weaken a bond between surfaces of the two materials. "Low" or "poor wettability" therefore means that the bonding forces between the two surfaces are relatively weak, while "high" or "strong wettability" means that the bonding forces between the two surfaces are relatively strong.

Figure 2E:
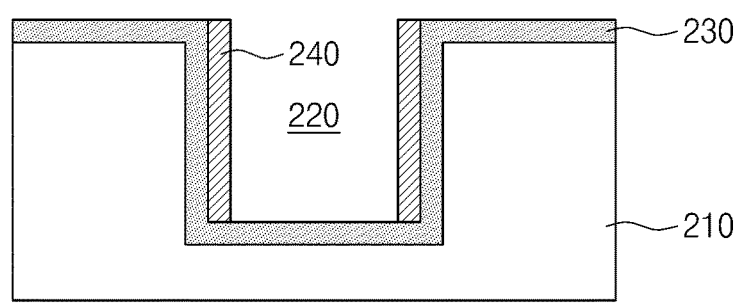
FIG. 2E is a schematic cross-sectional illustration of the ILD, trench, barrier layer, and liner layer of FIG. 2D, further illustrating the results of an etch process (i.e., a directional, anisotropic etch) performed on the liner layer to selectively remove the liner material from the trench bottom according to principles of the present inventive concepts.

FIG. 2E is a schematic cross-sectional illustration of the ILD 210, trench 220, barrier layer 230, and liner layer 240 of FIG. 2D, further illustrating the results of an etch process (i.e., a directional, anisotropic etch) performed on the liner layer 240 to selectively remove the liner material 240 from the trench bottom 222 according to principles of the present inventive concepts. Referring to FIG. 2E, after the first liner material 240 is deposited along the trench surfaces 222, 223, a portion of the first liner layer 240 is then preferably etched out from the trench bottom 222 to leave the first liner layer 240 only along the sidewalls 223 of the trench 220. Selective removal of the first liner material 240 from the trench bottom 222 may be accomplished, for instance, using a directional, anisotropic etching process.

Figure 2F:
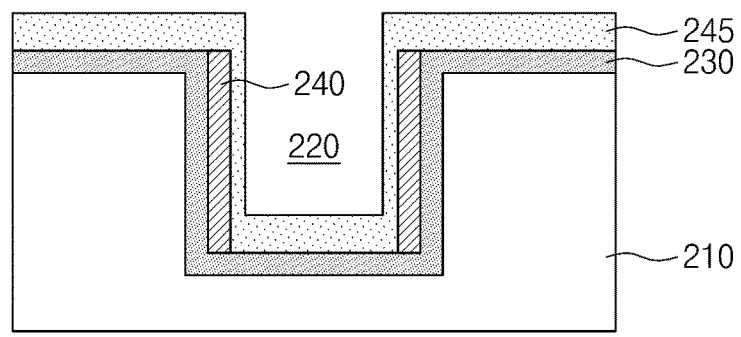
FIG. 2F is a schematic cross-sectional illustration of the ILD, trench, barrier layer, and etched liner layer of FIG. 2E, further illustrating the results of a directional deposition of a second liner layer material, different from the first liner material, on the trench bottom according to principles of the present inventive concepts.

FIG. 2F is a schematic cross-sectional illustration of the ILD 210, trench 220, barrier layer 230, and etched liner layer 240 of FIG. 2E, further illustrating the results of a directional deposition of a second liner layer material 245, different from the first liner material 240, on the trench bottom 222, according to additional principles of the present inventive concepts. Referring now specifically to FIG. 2F, a second liner material (Material 2) 245 is preferably directionally deposited on the trench bottom 222 which has had the first liner material 240 removed therefrom. The second liner material 245 is preferably selected such that it has a high wettability with respect to the conductive fill material (i.e., Cu) to be deposited in the trench 220. Suitable second liner materials 245 may include, for instance, Ruthenium (Ru) or high Ru content RuTa alloys.

Figure 2G:
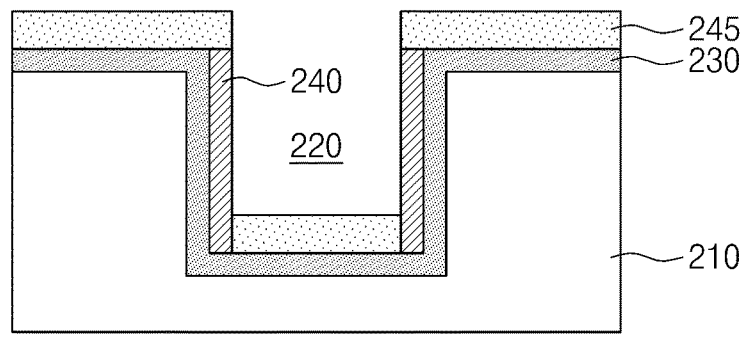
FIG. 2G is a schematic cross-sectional illustration of the ILD, trench, barrier layer, and first and second liner layers of FIG. 2F, further illustrating the results of an isotropic etch or clean process performed to remove second liner material from the trench sidewalls to expose the first liner material along the sidewalls.

FIG. 2G is a schematic cross-sectional illustration of the ILD 210, trench 220, barrier layer 230, and first and second liner layers 240, 245, respectively, of FIG. 2F, further illustrating the results of an isotropic etch or clean process performed to remove second liner material 245 from the trench sidewalls 223 to expose the first liner material 240 along the sidewalls 223. Referring now to FIG. 2G, after the second liner material 245 has been directionally deposited in the bottom of the trench 220, an isotropic etch or cleaning process can then be performed to remove any second liner material 245 from the trench sidewalls 223. This cleaning process ensures that only the low-wettability first liner material 240 is arranged and exposed along the trench sidewalls 223, while the high-wettability second liner material 245 is arranged and exposed at the trench bottom 222.

Figure 2H:
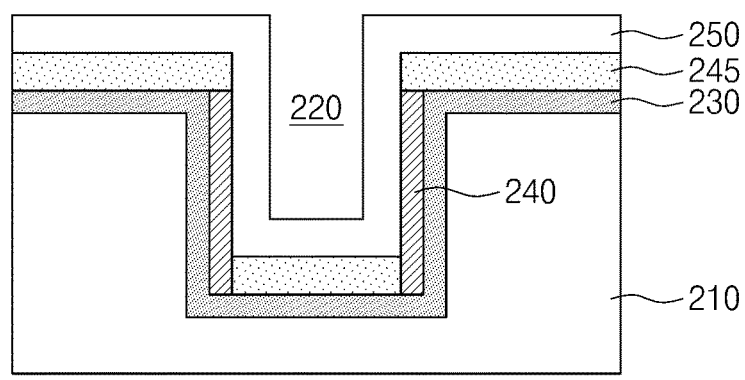
FIG. 2H is a schematic cross-sectional illustration of the ILD, trench, barrier layer, and processed first and second liner materials of FIG. 2G, further illustrating a Cu seed layer deposited onto the first and second liner layers, according to principles of the present inventive concepts.

FIG. 2H is a schematic cross-sectional illustration of the ILD 210, trench 220, barrier layer 230, and processed first and second liner layers 240, 245, respectively, of FIG. 2G, further illustrating a Cu seed layer 250 deposited onto the first and second liner layers 240, 245, respectively, according to principles of the present inventive concepts. Referring to FIG. 2H, once the cleaning process has been performed to ensure that the low-wettability first liner material 240 is exposed along the sidewalls 223, a conductive seed layer 250 can be deposited in the trench 220. The conductive seed layer 250 is used to control the subsequent growth of the conductive material (i.e. Cu) used to produce the conductive material layer 255 within the trench 220. A PVD or conformal CVD deposition process can be used, for instance, to deposit the Cu seed layer 250 coating the trench bottom 222 and sidewalls 223.

Figure 2I:
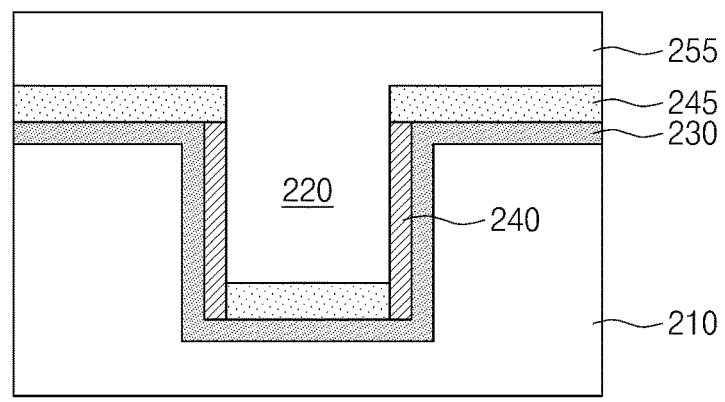
FIG. 2I is a schematic cross-sectional illustration of the ILD, trench, barrier layer, liner layers, and seed layer of FIG.

FIG. 2I is a schematic cross-sectional illustration of the ILD 210, trench 220, barrier layer 230, and liner layers 240, 245 of FIG. 2H, further illustrating the electrodeposition of the conductive material (i.e., Cu) on the seed layer 250 to fill in the trench 220 and form the conductive material layer 255, according to additional principles of the present inventive concepts. Referring now to FIG. 2I, after the seed layer 250 has been deposited along the trench bottom 222 and sidewalls 223, the conductive material (i.e., Cu) can be electro-deposited on the seed layer 250 to completely fill in the trench 220 and form the conductive material layer 255.

By selecting a liner material 245 for the bottom trench surface 222 that has high wettability with respect to the conductive fill material, and by selecting a liner material 240 for the trench sidewalls 223 that has low wettability with respect to the conductive fill material, the grain orientation of the grown conductive fill material can be controlled by energy minimization of the free surface of the fill material and by the stronger bond with the trench bottom 222. This process therefore encourages grain growth in the desired [111] orientation and results in a damascene interconnect structure 200 having lower resistivity.

As suggested above, another important consideration in the formation of the desired [111] structure is the surface energy of the free surface of the conductive fill material (i.e., Cu). "Surface energy," or "interface energy," quantifies the disruption of intermolecular bonds that occur when a surface is created. In the physics of solids, surfaces must be intrinsically less energetically favorable than the bulk of a material (i.e., the molecules on the surface have more energy compared with the molecules in the bulk of the material), otherwise there would be a driving force for surfaces to be created, removing the bulk of the material (such as through sublimation). The surface energy may therefore be defined as the excess energy at the surface of a material compared to the bulk. Energy minimization at the free surface of the conductive fill material encourages grain formation oriented in a direction transverse to the direction of electron transport.

Figure 2J:
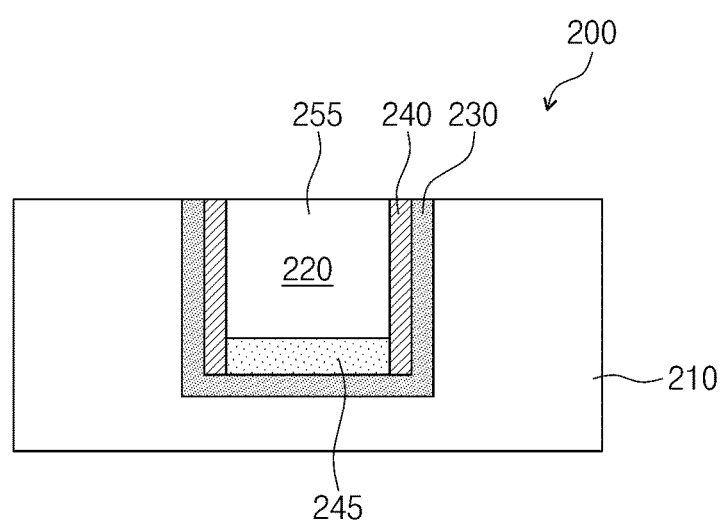
FIG. 2J is a schematic cross-sectional illustration of the ILD, trench, barrier layer, liner layer, seed layer, and electrodeposited Cu fill of FIG. 2I, further illustrating the results of a Chemical Mechanical Planarization (CMP) process performed to form the damascene interconnect structure according to principles of the present inventive concepts.

FIG. 2J is a schematic cross-sectional illustration of a completed damascene interconnect structure 200. Referring to FIG. 2J, once the conductive material layer 255 has been formed by depositing the conductive fill material in the trench 220 as illustrated in FIG. 2I, a chemical-mechanical planarization (CMP) process can be performed on the dielectric 210, barrier layer 230, liner layer 245, and conductive material layer 255, to remove the excess materials and complete the damascene interconnect structure 200. Annealing of the BEOL assembly can further be performed to promote bonding between an adhesion layer and Cu. The foregoing process steps may be performed as many times as is required at desired locations on the semiconductor substrate (i.e., a chip) to form any desired number of interconnect structures 200.

As shown in FIG. 2J, a low-resistivity damascene interconnect 200 according to principles of the present inventive concepts may include a dielectric 210 having a trench 220 formed therein. A barrier layer 230 may be arranged along a bottom 222 and side 223 surfaces of the trench 220, and a first liner material 240 may be arranged along sidewalls 223 of the trench 220 directly contacting the barrier layer 230. A second liner material 245 may be arranged on top of the barrier layer 230 covering a bottom surface 222 of the trench 220. A conductive material 255 may be arranged contacting the first and second liner materials 240, 245, respectively, and filling a remainder of the trench 220. The conductive material in the conductive material layer 255 may have a [111] orientation transverse to a direction of electron transport through the interconnect 200. The conductive material may, for instance, be Cu.

As previously explained, according to the present inventive concepts, each of the liner materials (Materials 1 and 2) may be selected such that the Cu grain orientation is controlled primarily by energy minimization of the free Cu surface and trench bottom/Cu layer. This can be accomplished, for instance, by selecting a material for the liner layer arranged on the trench bottom that wets very strongly to Cu and that is known to favor formation of a dominant Cu [111] grain distribution. In addition to Cu, Al, Ag, and Au that may be used for the interconnect material, alloys of these metals may also be used. Furthermore, Co, W, Ru, Mo, and/or silicides could alternatively be used, but the liner materials used in these instances would not be the same as those for Cu.

On the other hand, the sidewall liner may be formed from a material that wets very poorly to Cu during deposition and the initial period of grain growth. By selecting different bottom and sidewall liner layer materials having different wettability with respect to Cu, the principles of the inventive concepts enable growth of Cu [111] oriented grains transverse to the direction of electron transport, resulting in an interconnect morphology having a dominant Cu [111] orientation that is transverse to the direction of electron transport, and thereby having improved interconnect conductivity.

While Cu provides a desirable interconnect material, materials other than Cu may additionally, or alternatively, be used for the interconnect. For instance, aluminum (Al), gold (Au), and silver (Ag) all possess [111] crystalline structures suitable for the purposes of the inventive concepts. Other FCC metals may also be acceptable. The list of possible materials is expansive and can include, for instance, any of the metals mentioned above combined in a suitable alloy composition. Alternatively, AlCo, CuSn, CuW, or CuMn could be used in varying proportions. For other metals such as metal silicides or BCC/HCP metals such as Ta, Ru, W, Mo, Co, or their alloys, the liner materials would not be the same since the crystal structure of the conductive metal is different, but alternate liner materials that satisfy the present inventive concepts could be utilized. When a material other than Cu is used for the interconnect, the bottom and sidewall liner layer materials should again be selected to encourage growth of the material in a way that reduces resistivity. This can be accomplished, for instance, for conductive materials exhibiting [111] grain structures by selecting a sidewall liner layer material that has relatively low wettability with respect to the conductive fill material, and by selecting a bottom liner layer material that has relatively high wettability with respect to the conductive fill material. In addition, although the primary embodiment involves the use of different liner materials (Materials 1 and 2) for the sidewall and trench bottom liner layers, an alternative embodiment contemplates the use of the same material for the sidewall and trench bottom liner, but with the various liner layers having different thicknesses from each other.

For example, a thickness of a liner material layer arranged along a sidewall of the trench could be either thicker or thinner than a thickness of a liner material layer of the same (or different) material arranged along a bottom of the trench. Since different material thicknesses can affect the degree of influence of the liner layer on the subsequently formed interconnect, by adjusting the thickness of the various liner layers, their relative effect on the formation of the conductive layer can be controlled to promote the desired grain orientation. Approximate dimensions of the liner layer thicknesses in an example embodiment could, for example, be 0.5 nm of Ru liner on the trench sidewalls and 1.5 nm to 2 nm of liner on the trench bottom. One possible way to achieve this is through the deposition of a smaller amount of the first liner material on sidewalls prior to a directional etch of the trench bottom and directional deposition of second liner material.

In alternative embodiments, the same material can be used for both the bottom liner and sidewall liner. The liner material could, for instance, be Ru, Ta or any other suitable liner material. In these embodiments, the favorable grain structure orientation and corresponding beneficial electron transport properties are not related to the relative wettability of the materials, but are instead related to the role of the trench bottom in forming the eventual grain structure of the conductive material. For instance, using a larger thickness for the trench bottom promotes the growth of isotropic grains in the conductive material.

In summary, according to certain principles of the inventive concepts, different barrier/liner materials may be used on the sidewall and trench bottom of a damascene interconnect. More specifically, a first barrier or liner material (Material 1) with poor wetting to Cu may be disposed on the sidewalls, while a second barrier or liner material (Material 2), different from the first barrier or liner material, with strong wetting to Cu is provided on the trench bottom. With this configuration, the low interface energy of the Cu-trench bottom barrier can be allowed to dominate the grain formation process encouraging grain formation in a [111] structure oriented transverse to the direction of electron transport.

A method of forming a low resistivity damascene interconnect comprises forming a trench in an inter-layer dielectric, conformally depositing (i.e., via CVD or ALD) a barrier layer to prevent diffusion, and conformally depositing a first liner material having very low wettability to Cu (for instance, Ta). A directional etching process may then be performed to remove the first liner material from trench bottom (for instance using a barrier sputter reactor). A second liner material (for instance, Ru) having a very high wettability to Cu can then be directionally deposited on the trench bottom. PVD or conformal CVD deposition can be used to deposit a Cu seed layer coating the trench bottom and sidewalls. And electrodeposition of Cu can then be performed to fill in the resultant trench. A Chemical Mechanical Planarization (CMP) process can be performed to remove excess Cu. And annealing of the BEOL assembly can be performed to promote bonding between an adhesion layer and Cu. These processes can be performed as many times as is required at desired locations on a substrate.

The primary advantages of the present inventive concepts are that they enable formation of damascene interconnects with a dominant [111] orientation in a direction normal to the interconnect plane, and improve conductivity of Cu without need for alloying, instead relying on the formation of grains with orientations favorable for electron transport. Although additional steps are required to deposit and etch different barrier/liner materials on the sidewall and trench bottom, the process allows the creation of low-resistivity interconnects having smaller pitch dimensions.

While the principles of the present inventive concepts have been shown and described with respect to particular exemplary embodiments, the inventive principles are not limited to those specific embodiments. In particular, variations and enhancements with respect to the described implementations can be made, and other implementations will be understood by those skilled in the art, based on what is described and illustrated in this document. Accordingly, the inventive concepts should not be construed as being limited to the specific embodiments disclosed herein.

For example, since the primary inventive concept is to promote trench bottom/Cu adhesion and minimization of this interface energy at cost of Cu/sidewall interface energy, any interconnect architecture that achieves this aim would be within the scope of the present inventive principles. From a materials standpoint, FCC metals such as Al, Ag, Au have [111] as the preferred orientation with minimum surface energy, and any of these could therefore provide a suitable alternative to Cu for the interconnect material. In general, other metals suitable for electronic conduction also share this property and could likewise be used but may have a different preferred dominant orientation. Thus, various different suitable combinations of liner materials could be selected for the trench bottom and the sidewalls provided they have relatively high and low wettability, respectively, with regard to the selected interconnect material. In addition, various thicknesses of liner layers formed from the same or different materials could be used to control the grain growth of the conductive material. By selecting various appropriate combinations of materials and/or layer dimensions, numerous alternate embodiments with different interconnect/liner materials may be realized within the scope of the present inventive concepts.

What is claimed is:

1. A low resistivity damascene interconnect, comprising:
a dielectric material having a trench formed therein;
a first liner material arranged along sidewalls of the trench but not a bottom surface of the trench;
a second liner material, different from the first liner material, arranged along a bottom surface of the trench but not contacting or arranged along sidewalls of the trench; and
a conductive material deposited on and contacting the first and second liner materials and filling the trench,
wherein the first liner material has a relatively low wettability with respect to the conductive material,
wherein the second liner material has a relatively high wettability with respect to the conductive material,
wherein the conductive material has a preferred metal grain orientation that is a crystalline [111] structure oriented in a direction that is transverse to a direction of electron transport through the interconnect, and
wherein a pitch dimension of the interconnect is less than approximately 30 nm.

2. An interconnect according to claim 1, wherein the conductive material is copper (Cu), aluminum (Al), gold (Au), or silver (Ag).

3. An interconnect according to claim 1, wherein the first liner material is tantalum (Ta), and wherein the second liner material is Ruthenium (Ru).

4. An interconnect according to claim 1, wherein the first liner material and the second liner material comprise thicknesses that are different from each other.

5. An interconnect according to claim 1, wherein the first liner material is arranged between the second liner material and sidewalls of the trench.

6. An interconnect according to claim 4, wherein a thickness of the first liner material is approximately 0.5 nm and wherein a thickness of the second liner material is approximately between 1.5 nm and 2 nm.

7. An interconnect according to claim 1, wherein a thickness of the first liner material is thinner than a thickness of the second liner material.

8. An interconnect according to claim 7, wherein a thickness of the second liner material is between approximately 1.5 nm and approximately 2 nm.

9. An interconnect according to claim 1, further comprising a barrier layer arranged along the bottom and sidewalls of the trench between the dielectric and the respective first and second liner materials.

10. An interconnect according to claim 1, wherein a pitch dimension of the interconnect is less than about 15 nm.

11. A method of forming a damascene interconnect, the method comprising:
forming a trench in an inter-layer dielectric (ILD);
conformally depositing a diffusion barrier layer along sidewalls and a bottom surface of the trench;
conformally depositing a first liner layer comprising a first liner material on the diffusion barrier layer;
removing the first liner layer from the diffusion barrier layer except along sidewalls of the trench;
forming a second liner layer comprising a second liner material along a bottom surface of the trench but not along sidewalls of the trench after removing the first liner layer from the bottom surface of the trench, such that the first liner material is arranged between the second liner material and sidewalls of the trench;
depositing a conductive seed layer of a conductive material on the first and second liner layers; and
filling the trench with the conductive material overlying the conductive seed layer,
wherein the first liner material is selected having a relatively low wettability with respect to the conductive material,
wherein the second liner material is selected having a relatively high wettability with respect to the conductive material,
wherein the conductive material has a preferred metal grain orientation that is a crystalline [111] structure oriented in a direction that is transverse to a direction of electron transport through the interconnect, and
wherein a pitch dimension of the interconnect is less than approximately 30 nm.

12. The method of claim 11, further comprising performing a chemical mechanical planarization (CMP) process after filling the trench with the conductive material to form the damascene interconnect structure.

13. The method of claim 11, wherein the conductive material is copper (Cu), wherein the first liner material is tantalum (Ta), and wherein the second liner material is ruthenium (Ru).

14. The method of claim 11, wherein forming the second liner layer comprises directionally depositing the second liner material on horizontal surfaces of the ILD and performing an etch or cleaning process to remove any second liner material inadvertently deposited on vertical surfaces of the trench.

15. The method of claim 11, further comprising forming multiple damascene interconnects and wherein the damascene interconnects are formed at a same integration level or a different integration level from other damascene interconnects formed by the same method.

16. A damascene interconnect comprising:
a dielectric having a trench formed therein;
a first liner material arranged along sidewalls of the trench but not a bottom surface of the trench;
a second liner material arranged along the bottom surface of the trench but not contacting or arranged along the sidewalls of the trench,
wherein the second liner material is different from the first liner material,
wherein the first liner material has relatively low wettability with respect to the conductive material, and
wherein the second liner material has relatively higher wettability with respect to the conductive material; and
a conductive material filling the trench,
wherein the conductive material has a preferred grain orientation that is transverse to a direction of electron transport through the interconnect, said transverse preferred grain orientation resulting from the difference between the first and second liner materials and a minimization of an energy of a free surface of the conductive material, and
wherein a pitch dimension of the interconnect is less than approximately 15 nm.

17. The interconnect of claim 16, wherein the first liner material is tantalum (Ta), wherein the second liner material is Ruthenium (Ru), and wherein a thickness of the first liner material is thinner than a thickness of the second liner material.

18. The interconnect of claim 17, wherein a thickness of the second liner material is between approximately 1.5 nm and approximately 2 nm.

19. The interconnect of claim 16, wherein the interconnect is formed from a single damascene interconnect process for a conductive line.

20. The interconnect of claim 16, wherein the interconnect is formed at a same integration level or a different integration level than other damascene interconnects formed by the same method.

* * * * *